US011955990B2

(12) United States Patent
Liau

(10) Patent No.: US 11,955,990 B2
(45) Date of Patent: Apr. 9, 2024

(54) COMMUNICATION THROUGHPUT DESPITE PERIODIC BLOCKAGES

(71) Applicant: Hughes Network Systems, LLC, Germantown, MD (US)

(72) Inventor: Victor Liau, Gaithersburg, MD (US)

(73) Assignee: Hughes Network Systems, LLC, Germantown, MD (US)

(*) Notice: Subject to any disclaimer, the term of this patent is extended or adjusted under 35 U.S.C. 154(b) by 0 days.

(21) Appl. No.: 18/111,986

(22) Filed: Feb. 21, 2023

(65) Prior Publication Data

US 2023/0283300 A1    Sep. 7, 2023

Related U.S. Application Data

(63) Continuation of application No. 17/564,535, filed on Dec. 29, 2021, now Pat. No. 11,601,140, which is a
(Continued)

(51) Int. Cl.
*H03M 13/00* (2006.01)
*H03M 13/09* (2006.01)
(Continued)

(52) U.S. Cl.
CPC ..... *H03M 13/2778* (2013.01); *H03M 13/098* (2013.01); *H04B 7/18508* (2013.01)

(58) Field of Classification Search
CPC ........... H03M 13/098; H03M 13/2703; H03M 13/276; H03M 13/03; H03M 13/275;
(Continued)

(56) References Cited

U.S. PATENT DOCUMENTS 5,835,165 A    11/1998   Keate et al.
5,912,902 A     6/1999   Monroe
(Continued)

FOREIGN PATENT DOCUMENTS

EP    0794631    9/1997
EP    1710941   10/2006
(Continued)

OTHER PUBLICATIONS

Etsi.org, Digital video broadcasting (DVB); Second generation framing structure, channel coding and modulation systems for broadcasting, interactive services, news gathering and other broadband satellite applications; Part 2: DVB-S2 Extensions (DVB-S2X), Jul. 28, 2021, 166 pages.
(Continued)

*Primary Examiner* — Esaw T Abraham
(74) *Attorney, Agent, or Firm* — Fish & Richardson P.C.

(57) ABSTRACT

Methods, systems, and apparatus, including computer programs encoded on computer-storage media, for improving communication throughput despite periodic blockages. In some implementations, a method includes receiving, by a receiver and from a transmitter, code blocks transmitted according to a first set of communication parameters that includes one or more first interleaver parameters used to interleave information in the code blocks prior to transmission. Corrupted portions of at least some of the received code blocks are identified. A blockage duration and a blockage interval of a blockage of communication channel between the transmitter and the receiver are determined based on the corrupted portions of the received code blocks. A second set of communication parameters that includes one or more second interleaver parameters are determined based on the blockage duration and blockage interval. The second set of communication parameters are communicated to the
(Continued)

transmitter for subsequent transmissions by the transmitter to the receiver.

20 Claims, 7 Drawing Sheets

Related U.S. Application Data continuation of application No. 16/698,086, filed on Nov. 27, 2019, now Pat. No. 11,223,372.

(51) Int. Cl.
*H03M 13/27* (2006.01)
*H04B 7/185* (2006.01)

(58) Field of Classification Search
CPC ............. H03M 13/27; H03M 13/2742; H03M 13/2792; H04B 7/18508
See application file for complete search history.

(56) References Cited

U.S. PATENT DOCUMENTS

| | | | |
|---|---|---|---|
| 6,055,277 A | 4/2000 | Stephens et al. | |
| 6,763,025 B2 | 7/2004 | Leatherbury et al. | |
| 6,829,308 B2 | 12/2004 | Eroz et al. | |
| 7,142,521 B2 | 11/2006 | Haugli et al. | |
| 7,161,988 B2 | 1/2007 | Lee et al. | |
| 7,197,690 B2 | 3/2007 | Shen et al. | |
| 7,281,192 B2 | 10/2007 | Shen et al. | |
| 7,296,208 B2 | 11/2007 | Sun et al. | |
| 7,322,005 B2 | 1/2008 | Shen et al. | |
| 7,383,493 B2 | 6/2008 | Shen et al. | |
| 7,436,902 B2 | 10/2008 | Shen et al. | |
| 7,451,361 B2* | 11/2008 | Schmidt | H04L 27/3488 |
| | | | 714/701 |
| 7,581,162 B2 | 8/2009 | Eroz et al. | |
| 7,590,083 B2 | 9/2009 | Haugli et al. | |
| 7,721,184 B2 | 5/2010 | Luby et al. | |
| 7,770,089 B2 | 8/2010 | Eroz et al. | |
| 7,907,641 B2 | 3/2011 | Sun et al. | |
| 7,954,036 B2 | 5/2011 | Eroz et al. | |
| 7,995,578 B2 | 8/2011 | Kim et al. | |
| 8,028,224 B2 | 9/2011 | Eroz et al. | |
| 8,069,393 B2 | 11/2011 | Eroz et al. | |
| 8,102,947 B2 | 1/2012 | Eroz et al. | |
| 8,140,931 B2 | 3/2012 | Eroz et al. | |
| 8,140,946 B2 | 3/2012 | Eroz et al. | |
| 8,144,801 B2 | 3/2012 | Eroz et al. | |
| 8,145,980 B2 | 3/2012 | Eroz et al. | |
| 8,170,502 B2 | 5/2012 | Seshardi et al. | |
| 8,181,085 B2 | 5/2012 | Eroz et al. | |
| 8,238,284 B2 | 8/2012 | Wilcoxson et al. | |
| 8,254,303 B2 | 8/2012 | Becker et al. | |
| 8,275,081 B2 | 9/2012 | Jiang et al. | |
| 8,286,050 B2* | 10/2012 | Murakami | H03M 13/2742 |
| | | | 714/752 |
| 8,320,296 B2 | 11/2012 | Becker et al. | |
| 8,326,213 B2 | 12/2012 | Sun et al. | |
| 8,369,448 B2 | 2/2013 | Zhang et al. | |
| 8,392,793 B2 | 3/2013 | Eroz et al. | |
| 8,402,341 B2 | 3/2013 | Eroz et al. | |
| 8,483,308 B2 | 7/2013 | Eroz et al. | |
| 8,527,833 B2 | 9/2013 | Seshardi et al. | |
| 8,571,480 B2 | 10/2013 | Lee et al. | |
| 8,615,699 B2 | 12/2013 | Eroz et al. | |
| 8,619,974 B2 | 12/2013 | Fang et al. | |
| 8,683,288 B2 | 3/2014 | Shen et al. | |
| 8,683,292 B2 | 3/2014 | Lee et al. | |
| 8,782,489 B2 | 7/2014 | Eroz et al. | |
| 8,792,322 B2 | 7/2014 | Stadelmeier et al. | |
| 8,837,618 B2* | 9/2014 | Petrov | H03M 13/255 |
| | | | 375/323 |
| 8,887,024 B2 | 11/2014 | Eroz et al. | |
| 8,891,434 B2 | 11/2014 | Wesley et al. | |
| 8,964,896 B2 | 2/2015 | Lee et al. | |
| 8,976,727 B2 | 3/2015 | Wilcoxson et al. | |
| 9,009,559 B2 | 4/2015 | Lee et al. | |
| 9,118,353 B2 | 8/2015 | Eroz et al. | |
| 9,130,814 B2 | 9/2015 | Petrov et al. | |
| 9,143,277 B2 | 9/2015 | Becker et al. | |
| 9,203,431 B2 | 12/2015 | Lee et al. | |
| 9,203,492 B2 | 12/2015 | Eroz et al. | |
| 9,240,807 B2* | 1/2016 | Oketani | H03M 13/6525 |
| 9,246,634 B2 | 1/2016 | Eroz et al. | |
| 9,264,675 B2 | 2/2016 | Antia et al. | |
| 9,294,131 B2 | 3/2016 | Eroz et al. | |
| 9,306,791 B2 | 4/2016 | Delaruelle | |
| 9,319,172 B2 | 4/2016 | Jalali et al. | |
| 9,397,704 B2 | 6/2016 | Eroz et al. | |
| 9,391,642 B2 | 7/2016 | Eroz et al. | |
| 9,515,723 B2 | 12/2016 | Beidas et al. | |
| 9,564,927 B2* | 2/2017 | Fonseka | H03M 13/036 |
| 9,572,166 B2 | 2/2017 | Pandey | |
| 9,602,132 B2* | 3/2017 | Ito | H03M 13/1111 |
| 9,614,554 B2 | 4/2017 | Beidas et al. | |
| 9,628,867 B2 | 4/2017 | Qin et al. | |
| 9,634,870 B2 | 4/2017 | Beidas et al. | |
| 9,819,530 B2 | 11/2017 | Yaman et al. | |
| 9,941,952 B2 | 4/2018 | Antia et al. | |
| 10,020,965 B2 | 7/2018 | Beidas et al. | |
| 10,104,631 B2 | 10/2018 | Lee et al. | |
| 10,142,056 B2* | 11/2018 | Klenner | H04L 1/0041 |
| 10,168,938 B2 | 1/2019 | Chen et al. | |
| 10,237,016 B2 | 3/2019 | Beidas et al. | |
| 10,263,814 B2 | 4/2019 | Eroz et al. | |
| 10,277,434 B2 | 4/2019 | Chung et al. | |
| 10,305,633 B2* | 5/2019 | Manolakos | H03M 13/2757 |
| 10,348,449 B2 | 7/2019 | Rainish et al. | |
| 10,484,084 B2 | 11/2019 | Lee et al. | |
| 10,523,237 B2* | 12/2019 | Li | H03M 13/114 |
| 10,530,394 B2 | 1/2020 | Eroz et al. | |
| 10,630,512 B2 | 4/2020 | Eroz et al. | |
| 10,680,712 B2 | 6/2020 | Boroson et al. | |
| 10,727,980 B2 | 7/2020 | Peyla et al. | |
| 10,763,993 B2 | 9/2020 | Eroz et al. | |
| 11,012,095 B2 | 5/2021 | Eberlein et al. | |
| 11,025,456 B2 | 6/2021 | Chatterjee et al. | |
| 11,558,149 B2* | 1/2023 | Li | H04L 1/0057 |
| 2004/0252725 A1 | 12/2004 | Sun et al. | |
| 2008/0082895 A1 | 4/2008 | Eroz et al. | |
| 2011/0258669 A1 | 10/2011 | Antia et al. | |
| 2013/0154755 A1 | 6/2013 | Eroz et al. | |
| 2019/0013892 A1 | 1/2019 | Chen et al. | |
| 2020/0280827 A1 | 9/2020 | Fechtel et al. | |
| 2021/0044371 A1 | 2/2021 | Chen et al. | |

FOREIGN PATENT DOCUMENTS

| | | |
|---|---|---|
| EP | 2639155 | 9/2013 |
| WO | WO 2016/168253 | 10/2016 |
| WO | WO 2016/187170 | 11/2016 |

OTHER PUBLICATIONS

International Search Report and Written Opinion in International Appln. No. PCT/US2023/064132, dated Jun. 7, 2023, 15 pages.

Jia et al., "Joint occlusion detection and phase estimation algorithm for helicopter satellite communication," IEEE Transactions on aerospace and electronic systems, Jun. 3, 2019, pp. 687-697.

Wang et al., "Design of check-hybrid LDPC codes for data communications over helicopter-satellite channels," IEEE, Sep. 24, 2017, Sep. 24, 2017, 5 pages.

Benedetto et al., "MHOMS: high-speed ACM modem for satellite applications," IEEE Wireless Communications, May 2005, 12(2):66-77.

International Preliminary Report on Patentability in International Appln. No. PCT/US2020/060699, dated Jun. 9, 2022, 10 pages.

International Search Report and Written Opinion in International Appln. No. PCT/US2020/060699, dated Mar. 3, 2021, 16 pages.

(56) References Cited

OTHER PUBLICATIONS static1.squarespace.com [online], "Developments in Advanced SATCOM Networking from Hughes," Nov. 10, 2015, retrieved on Feb. 11, 2020, retrieved from URL<https://static1.squarespace.com/static/5274112ae4b02d3f058d4348/t/564e761ce4b0b03843732515/1447982620364/2015-2-6b.pdf>, 61 pages.
Wikipedia [online], "Gray code," last edited Jan. 29, 2022, retrieved on Feb. 7, 2022, retrieved from URL <https://en.wikipedia.org/wiki/Gray_code>, 25 pages.
Wikipedia [online], "Modulation," last edited Dec. 17, 2021, retrieved on Feb. 7, 2022, retrieved from URL <https://en.wikipedia.org/wiki/Modulation>, 9 pages.
Zhang et al., "Multi-ring PSK Constellation Design for Spatial Modulation Transmission," Proceedings of the International Conference on Computer Information Systems and Industrial Applications, Jun. 2015, 4 pages.
Zhang et al., "Novel APM constellation design for spatial modulation systems," International Conference on Wireless Communications & Signal Processing (WCSP), Dec. 3, 2015, 5 pages.
Office Action issued in European Appln. No. 20821529.3, dated Jan. 19, 2024, 7 pages.

\* cited by examiner

Code Rate 1/2

Code Rate 2/3

Data Row 1 (col. 1 row 1):     0101010101

Data Row 2 (col. 1 row 2):     1010101010

Parity Row (col. 1, row 3):     1111111111
  (XOR of Data Rows 1 and 2)

XOR of Column 1:                    0000000000

COMMUNICATION THROUGHPUT DESPITE PERIODIC BLOCKAGES

CROSS-REFERENCE TO RELATED APPLICATIONS

This application is a continuation of U.S. application Ser. No. 17/564,535, filed Dec. 29, 2021, now U.S. PN: 11,601,140, which is a continuation of U.S. application Ser. No. 16/698,086, filed Nov. 27, 2019, now U.S. Pat. No. 11,223,372. The foregoing applications are incorporated herein by reference in their entirety for all purposes.

TECHNICAL FIELD

The present specification relates to improving communication throughput despite blockages.

BACKGROUND

Transmissions between transmitter and a receiver can be subjected to recurring blockages. For example, transmissions between a satellite terminal of a helicopter and a satellite can be periodically blocked by the spinning rotor. The data that is blocked by the rotor may be corrupted, requiring either error correction or retransmission, which can take time and require unnecessary use of bandwidth and/or processing power.

SUMMARY

In some implementations, a communication system includes features to improve throughput in the presence of periodic blockage of the communication channel. The system can use an enhanced set of information in upper-layer protocol headers to improve performance.

One significant use for the technology is in improving communication for satellite terminals on helicopters, where the rotation of the helicopter blades causes periodic blockage of the line of communication to and from the satellite. The improvements to the upper-layer protocol, referred to as Upper Layer Protocol Enhancement (ULPE), aids in the protection of this type of periodic blockage. Communication operations using ULPE can take into account the incident angle between the helicopter blades and the line of communication between the satellite and the helicopter antenna. As the helicopter maneuvers, the incident angle changes, which affects periodicity of the blockage as well as the duration of the blockage. The communication system can autonomously configure and adapt the ULPE parameters to compensate for changes in the interruptions to the channel, for example, to set parameters corresponding to the type of communication interruption in order to improve, e.g., optimize, communication throughput.

The techniques discussed in this document remove the need to manually configure ULPE parameters, such as the code rate, for each aircraft and for each flight path. Further, rather than setting the ULPE parameters for the worst-case communication interruption in a flight path, the ULPE parameters can be autonomously and dynamically adjusted over the course of a flight. For example, the ULPE parameters can be adjusted to specify a higher code rate when the channel blockage is less severe to achieve higher throughput. On the other hand, the ULPE parameters can be adjusted to reduce the code rate when the channel blockage is more severe, to maintain erasure correction effectiveness at the expense of lower throughput.

In one general aspect, the techniques disclosed herein describe methods of improving communication throughput despite periodic blockages. According to some of the methods, a receiver receives, from a transmitter, code blocks transmitted according to a first set of communication parameters that includes one or more first interleaver parameters used to interleave information in the code blocks prior to transmission. Corrupted portions of at least some of the received code blocks are identified. A blockage duration and a blockage interval of a blockage of communication channel between the transmitter and the receiver are determined based on the corrupted portions of the received code blocks. The blockage duration is indicative of a duration of the blockage. The blockage interval is indicative of a period of time between successive blockages. A second set of communication parameters that includes one or more second interleaver parameters are determined based on the blockage duration and the blockage interval. The second set of communication parameters are communicated to the transmitter for subsequent transmissions by the transmitter to the receiver.

In some implementations, communicating the second set of communication parameters to the transmitter includes sending, to a receiver coupled to the transmitter, additional code blocks according to the second set of communication parameters.

In some implementations, communicating the second set of communication parameters to the transmitter comprises sending data specifying the second set of communication parameters to a receiver coupled to the transmitter.

In some implementations, the one or more second interleaver parameters are provided to be used to interleave data to be transferred and error checking data for the data to be transferred. The error checking data can be parity data.

In some implementations, the one or more first interleaver parameters include a number of rows and a number of columns. Each column represents a burst of information including multiple code block elements. The transmission of code block elements of different columns are interleaved. The number of rows is based on the first coding. At least one row of the interleaver is designated for error checking data. Some implementations include determining, by the receiver, the one or more first interleaver parameters based on the received set of code blocks and decoding, by the receiver, one or more of the received code blocks based on the determined one or more first interleaver parameters.

Some implementations include determining a total number of code block elements in a particular received code block by counting a number of code block elements between successive begin block indicators in the received set of code blocks, determining a number of columns of an interleaver used transmit the received code blocks by counting a number of code block elements, between successive begin block indicators, that are marked as error checking code blocks, and determining a number of rows of the interleaver by dividing the number of total number of code block elements in the particular received code block by the determined number of columns of the interleaver.

In some implementations, determining the second set of communication parameters includes determining a second number of columns for the interleaver based on a quotient obtained by dividing the blockage duration by a code block element duration that is a time duration needed to transmit one code block element. The second number of columns can be the quotient plus a predetermined value that is greater than or equal to one.

In some implementations, determining the second set of communication parameters includes determining a second number of rows based on a quotient obtained by dividing the blockage interval by a time duration needed to transmit all of the code blocks in a row and determining the second set of communication parameters comprises determining the second coding based on the second number of rows.

In some implementations, determining the blockage duration comprises determining a time duration for transmitting a series of consecutive code block elements that were each at least partially corrupted.

In some implementations, determining the blockage duration includes identifying multiple sequences of consecutive corrupted code block elements in multiple sets of code blocks, determining, for each sequence of consecutive corrupted code block elements, a time duration for transmitting the sequence of consecutive corrupted code block elements, and determining, as the blockage duration, an average of the durations of time.

In some implementations, determining the blockage interval includes identifying a first blockage corresponding to a first sequence of consecutive corrupted code block elements in the set of code blocks, identifying a second blockage corresponding to a second sequence of consecutive code block elements in the set of code blocks, and determining, as the blockage interval, a time duration between a beginning of the first blockage and a beginning of the second blockage. The first blockage and the second blockage are successive blockages without any intervening blockages.

In some implementations, determining the blockage interval includes identifying multiple pairs of successive blockages in code blocks, determining, for each pair of successive blockages, a time duration between a beginning of a first blockage in the pair of successive blockages and a beginning of a second blockage in the pair of successive blockages, and determining, as the blockage interval, an average of the durations of time.

In some implementations, the transmitter is a transmitter of a satellite, and wherein the receiver is mounted on a helicopter that is in flight, and the receiver is oriented to communicate with the transmitter along a path that is periodically blocked by a rotating rotor of the helicopter.

In some implementations, the blockage duration and the blockage interval are based on at least one of a width of the rotor, a speed of rotation of the rotor, and an angle of the line of communication between the transmitter and the receiver.

In some implementations, the receiver is configured to repeatedly evaluate the blockage interval and blockage duration along a flight path of a helicopter, and dynamically request different interleaver parameters in response to changes in the blockage interval and blockage duration.

Some implementations include receiving, from the transmitter, data indicating a time to switch to the second set of communication parameters, and monitoring for code blocks transmitted according to the second set of communication parameters when the time elapses.

Other embodiments include corresponding systems, apparatus, and software programs, configured to perform the actions of the methods, encoded on computer storage devices. For example, some embodiments include a satellite terminal and/or a satellite gateway configured to perform the actions of the methods. A device or system of devices can be so configured by virtue of software, firmware, hardware, or a combination of them installed so that in operation cause the system to perform the actions. One or more software programs can be so configured by virtue of having instructions that, when executed by data processing apparatus, cause the apparatus to perform the actions.

The details of one or more embodiments of the invention are set forth in the accompanying drawings and the description below. Other features and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
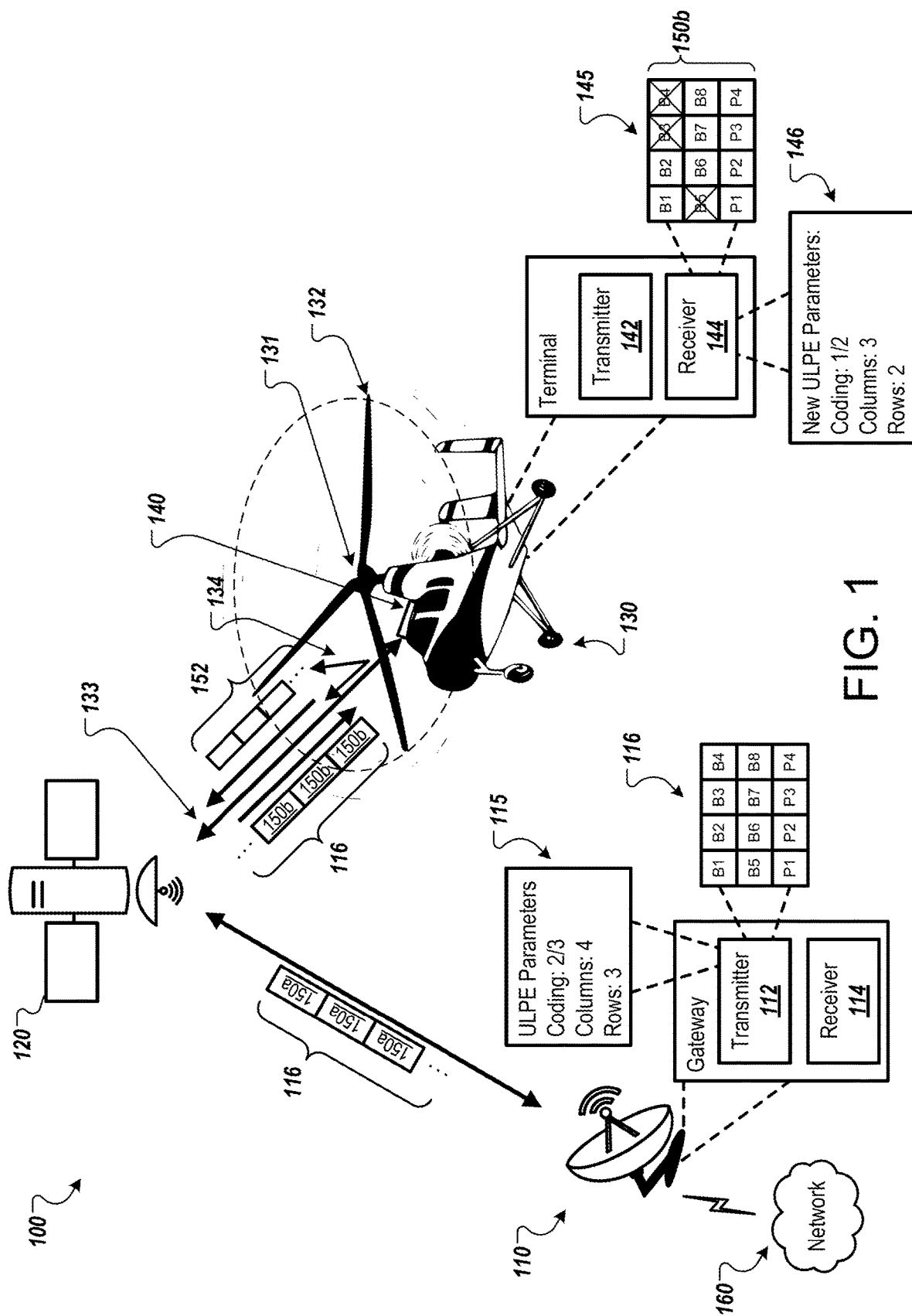
FIG. 1 is a diagram showing an example of a system capable of changing communication parameters to address a periodic blockage in a communication link.

FIG. 1 is a diagram showing an example of a system 100 capable of changing communication parameters to address a periodic blockage in a communication link. For example, the system 100 can dynamically change parameters, such as an amount of overhead or redundancy in communications, based on a blockage duration and blockage interval of the periodic blockage. The system 100 includes a satellite gateway 110, a satellite 120, and a satellite terminal 140. In the illustrated example, the satellite terminal 140 is mounted on a helicopter 130, although the techniques discussed herein can be applied to receivers in other configurations. The gateway 110 is connected to a network 160. The satellite 120, the gateway 110, and the terminal 140 can be part of a satellite communication network that includes one or more satellites, one or more gateways, and one or more terminals. Although the techniques described herein are described in terms of a satellite communication system, the techniques can be used with other wireless data communication systems. In addition, the techniques are described largely in terms of periodic blockages caused by helicopter rotors, but can be applied to other types of periodic blockages.

The gateway 110 includes a transmitter 112 and a receiver 114. Similarly, the terminal 140 includes a transmitter 142 and a receiver 144. The transmitter 112 can transmit data to the receiver 144 using a set of communication parameters. Similarly, the transmitter 142 can transmit data to the receiver 114 using a set of communication parameters. As described in more detail below, the communication parameters can include ULPE parameters including a coding and an interleaver parameter (e.g., an interleaver dimension involving one or more of a number of rows, a number of columns, a total number of elements, etc.). The coding can be a forward error correction (FEC) for the link, which is used to combat noise and other interference of a wireless link.

The terminal 140 can be mounted on a top portion of the helicopter 130 to communicate with the satellite 120. For example, the terminal 140 can be mounted above the cabin of the helicopter 130, on the nose of the helicopter 130, on the tail of the helicopter 130, or on or in another appropriate part of the helicopter 130. The helicopter 130 includes a rotor 131 with several blades 132. As the blades 132 rotate, the blades 132 intercept the line of communication 133 between the terminal 140 and the satellite 120 each time one of the blades 132 crosses the line of communication 133. Thus, the rotation of the blades 132 causes periodic blockages, e.g., repeated temporary interruptions in the ability of the receiver 144 to receive signals from the satellite 120.

The interval between successive blockages ("blockage interval") and the duration of an individual blockage ("blockage duration") can vary over time, such as during the course of travel of the helicopter 130. In this example, the blockage interval is the time duration between one blade 132 blocking the line of communication 133 and another blade 132 blocking the line of communication 133. The blockage duration is the amount of time that each individual blade 132 blocks the line of communication 133 as the blade 132 passes between the receiver 144 and the satellite 120.

When the helicopter maneuvers, e.g., changes direction or altitude, the incident angle 134 between the line of communication 133 and a normal to the surface of the blades 132 (e.g., an orientation perpendicular to the blades 132) changes. Similarly, if the helicopter 130 travels a long distance, the incident angle 134 can change based on a change in location of the helicopter 130 relative to the location of the satellite 130. In addition, the rotational speed of the rotor 131 can change during flight, e.g., based on a change in speed of the helicopter 130, resulting in a change in the blockage interval and the blockage duration.

The change in incident angle 134 can change the blockage interval and/or the blockage duration, as the incident angle 134 affects the width of the shadow of the blade 132 that blocks the line of communication 133, e.g., the size of the shadow of the blade 132 on the receiver 144. For example, the shadow of the blade 132 that blocks the line of communication 133 would be greater for a zero degree incident angle than for a 45 degree incident angle. The example incident angle 134 is shown as an approximate angle for exemplary purposes only and does not reflect the actual incident angle between the line of communication 133 and the normal to the blades 132.

The gateway 110 and/or the terminal 140 can adjust, e.g., autonomously without manual input, the communication parameters for communications between the gateway 110 and terminal 140 to account for the periodic blockages and to improve data throughput between the gateway 110 and the terminal 140. For example, one of the receivers 114 or 144, or a controller of the gateway 110 or terminal 140 can adjust the communication parameters based on current periodic blockages. This removes the need to manually configure the communication parameters for each helicopter and for each flight path. These techniques can be used to adaptively change the communication parameters over time to maintain communication in response to changing conditions, such as changes in the nature of the periodic blockage. In some implementations, a transmitter or receiver of the satellite 120 can adjust the communication parameters.

Each transmitter 112 and 142 can transmit data in a series of ULPE code blocks. For example, the transmitter 112 can transmit a series of ULPE code blocks to the satellite 120, and the satellite 120 can retransmit (e.g., forward) the ULPE code blocks to the receiver 144. The transmitter 142 of the satellite terminal 140 can transmit ULPE code blocks 152 to the receiver 114 via the satellite 120.

Each ULPE code block is composed of multiple code block elements. One example of a ULPE code block 116 is illustrated, and has code block elements labeled B1-B8 and P1-P4. These code block elements are illustrated as code block elements 150a being transmitted from the transmitter 112 to the satellite 120 and as code block elements 150b being transmitted from the satellite 120 to the receiver 144 of the satellite terminal 140. Transmission of a ULPE code block can be performed by the transmitter 112 can transmitting the code block elements 150a to the satellite 120 in sequence. In turn, the satellite 120 retransmits (e.g., forwards) the same sequence as code block elements 150b (that match the code blocks 150a) to the receiver 144. In some implementations, the transmitter 112 can transmit the sequence of code block elements in a ULPE code block as a single data burst.

Each of the ULPE code blocks can be generated and transmitted according to a set of communication parameters. Each ULPE code block can interleave data elements and corresponding error checking and correction data within the ULPE code block. The communication parameters can include ULPE parameters that include one or more interleaver parameters. Each ULPE code block can be composed of multiple code block elements, each of which may itself be a code block of a certain type. The code block elements 150a, 150b can include (1) code block elements generated using a low-density parity check code (LDPC) and (2) code block elements including error checking and correction (ECC) data, such as parity data. These code block elements can be organized into ULPE rows and columns to cause interleaving of the code block elements. The interleaver parameters can specify the number of ULPE rows and the number of ULPE columns used to organize elements into the ULPE code block that is transmitted.

In the example code block 116 shown, there are two rows of code block elements (e.g., one row with elements B1-B4 and another row with elements B5-B8). There is also one row of code block elements for parity data or other ECC data, labeled as elements P1-P4. The code block elements B1-B8 are each LDPC-encoded code blocks, and the parity code block elements P1-P4 provide parity information for their respective columns. The ULPC code block structure and the contents of the code block elements is discussed further with respect to FIGS. 2A-2C.

Figure 2A:
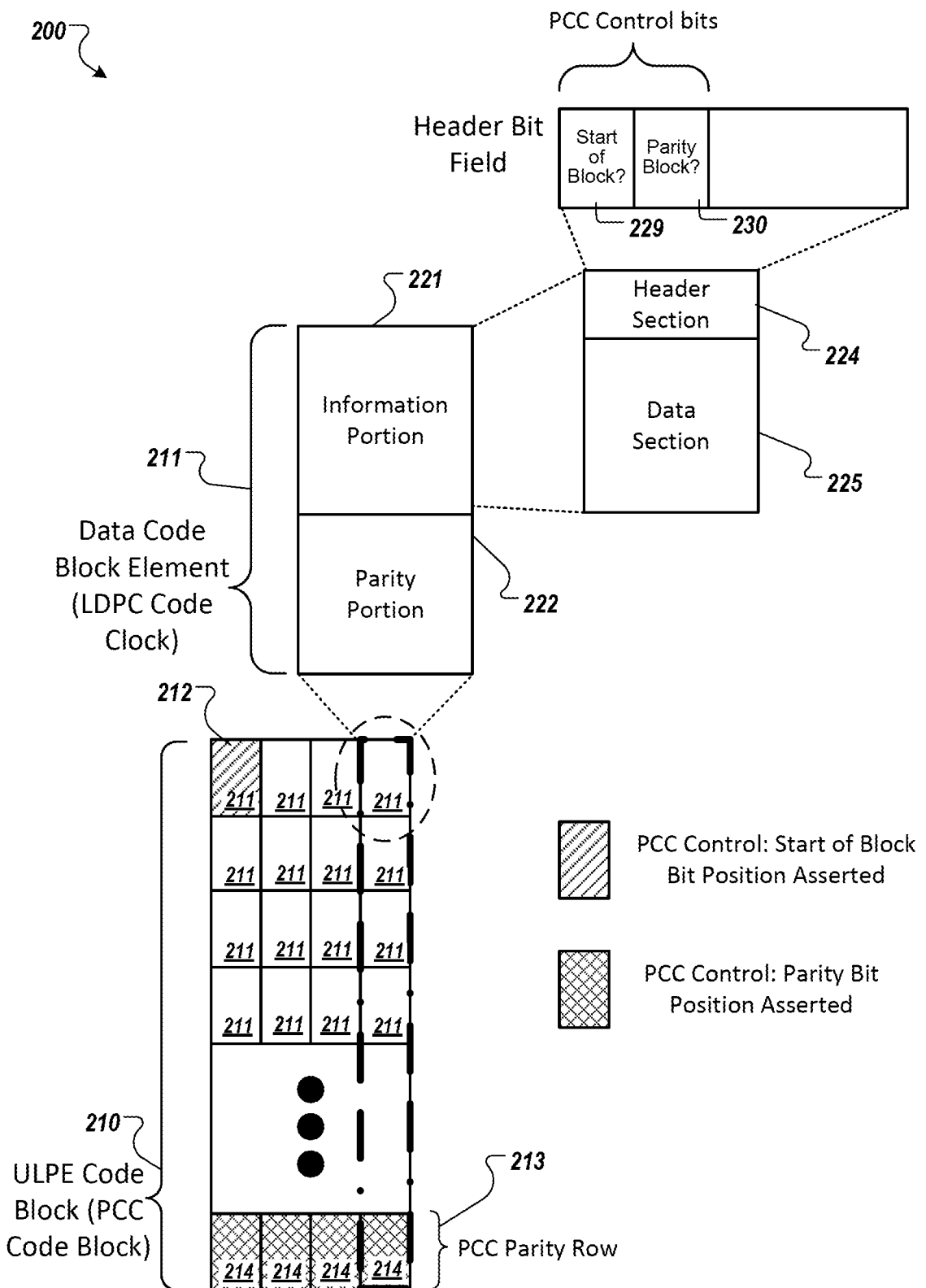
FIG. 2A is a diagram showing example components of code blocks.

Referring now to FIG. 2A, a diagram 200 shows a ULPC code block 210 that is made up rows and columns of code block elements 211, 214. The ULPC code block 210 is arranged to provide Parity Check Code (PCC) correction for each column. The number of rows and columns used in the code block 210 can be among the communication parameters varied by the system to address the periodic blockage. The columns represent a set of data to transmitted, along with corresponding parity data or other error detection and correction data. For example, each column includes data code block elements 211 as well as a parity code block element 214 including parity data for the data code block elements 211 in the column. This allows a receiver to evaluate each column separately to determine whether any corruption has occurred in reception of the column. Using LDPC or another technique, parity or error detection and correction information is provided for individual code block elements 211 (e.g., in parity portion 222).

In the particular example illustrated in FIG. 2A, the code block elements 211 are arranged in four ULPE columns and multiple rows including more than four data rows that include data to be transferred and an ECC or parity row 213 with error checking data. In this example, each column includes a predetermined number of data code block elements 211, followed by error checking data in a parity code block element 214 for the column. Each parity code block element 214 in the PCC parity row 213 includes error checking data for the column in which the parity code block element 214 is located. For example, the parity code block element 214 in the leftmost column includes error checking data for the set of code block elements 211 in the leftmost column.

The error checking data for a column can include parity bits that can be used to correct errors in the data in the column. In some implementations, the parity bits represent the result of an XOR operation of the bits in each data code block element 211 of the column. For example, if the ULPE code block 210 included four rows, the parity bits in each code block element 214 would be the result of an XOR operation involving all of the data code block elements 211 in the same column. For example, the parity data in the leftmost parity code block element 214 is obtained by performing an XOR of all four of the data code block elements 211 in the same column. In this way, if one of the code block elements in the first four rows of the leftmost column is corrupted, the parity bits can be used to detect the error and potentially to determine the correct value of the bits that were in the corrupted code block element.

An interleaver can interleave data into the individual LDPC code block elements 211 of the ULPE code block 210 based on the interleaver parameters. The interleaver parameters define the number of rows and the number of columns of the ULPE code block 210. The number of rows in the interleaver parameters can also define, or be defined by, the coding. For example, an FEC code rate represents the number of rows of data and the total number of rows. In a particular example, an 8/9 data rate indicates that the ULPE code block 210 will have 8 rows of data code block elements 211 and one row of parity code block elements 214.

Each code block element 211, 214 can be structured to have its own error detection and correction data. For example, each code block element 211, 214 can have an information portion 221 and a parity portion 222. The information portion includes a header section 224 and a data section 225. In the data code block elements 211, the data section 225 includes the data to be transmitted. In the parity code block elements 214, the data section 225 includes parity data for the data code block elements 211 in the column. In each code block element 211, 214, the parity portion can include parity data for the information portion 221, allowing a receiver to detect and/or correct corrupted data in the information portion 221.

In each code block element 211, 214, the header section 224 of the information portion 221 may include various fields or flags where control information can be placed. For example, the header section 224 includes PCC control bits 228, including a start of block control bit 229 (e.g., a Begin ULPE Code Block Indicator Bit) and a parity data assertion bit 230. In some implementations, the header section 224 can include a byte of data.

The start of block control bit 229 indicates whether the current code block element 211, 214 is the start of a ULPE code block 210. The start of block control bit 229 is asserted (e.g., set to "1" or another predetermined value) for the first data-carrying (e.g., LDPC-encoded) code block element 211 of each ULPE code block 210, and not asserted for the rest of the code block elements 211, 214. In this example, the start of block control bit 229 is set in code block element 212 (shown shaded in the upper-left corner in FIG. 2A), because code block element 212 is in the first row and the first column of the ULPE code block 210. This start of block control bit 229 indicates, to a receiver, that the code block element 212 is the beginning of a new ULPE code block 210.

The parity control bit 230 indicates whether the data section 225 includes data to be received or parity data for other code block elements. The parity control bit 230 is asserted (e.g., set to "1" or another predetermined value) in the header section 224 of each parity code block element 214 in the error checking row 213. This indicates that each parity code block element 214 in row 213 includes error checking data rather than data to be transferred. It also indicates that the content is different from the LDPC coding of the data code block elements 211. Other than a header section 224, the entire parity code block element 214 (e.g., data section 225 and 222) includes parity data, e.g., the result of an exclusive OR (XOR) operation over each of the data code block elements 211 in the same column.

A transmitter can transmit the ULPE code block 210 row-by-row, e.g., transmitting each code block element 211 of the ULPE code block 210 in order from left to right, from the top row to the bottom row. In this example, the ULPE code block 210 would be transmitted with the first row transmitted first, e.g., with the first data code block element 211 of each column being transmitted in sequence from left to right. Then the second row would be transmitted next, with the second data code block element 211 of each column being transmitted in sequence from left to right. This row-by-row pattern continues until the last row, in which the parity code block elements 214 in the error checking row 213 would be sent last. This mode of transmission interleaves the code block elements 211, 214 of the different columns. In other words, after a code block element 211 or 214 is transmitted from a first column, a code block element is transmitted from every other column before transmitting another code block element 211 or 214 from the first column.

The ULPE code block 210 includes, in addition to one or more rows of code blocks 211 containing data, a row of code blocks 214 containing error correction data. The error correction data can be determined such that performing an exclusive OR of all the blocks in a column (e.g., data bursts and the parity burst) results in a value of zero.

Figure 2B:
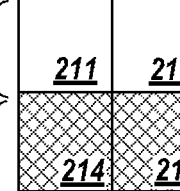
FIGS. 2B and 2C are diagrams showing additional examples of code blocks.

FIG. 2B shows an example of a ULPE code block 210 that uses a code rate of 1/2. With this code rate, there is one data code block element 211 per column, and two total code block elements per column, resulting in the ratio of 1/2. In this specific example, a parity code block element 214 is included for each data code block element 211. This represents the lowest-throughput option having the greatest robustness.

In the example of FIG. 2B, using a 1/2 code rate and with four columns, the ULPE code block 210 has a first row of code block elements 211, or a total of four code block elements 211 in which different sets of data are be sent. The ULPE code block 210 also has a second row of parity code block elements 214 with redundant information, e.g., four code block elements 214 each comprising the results performing an exclusive OR function for each bit of the data code block element 211 in the same column. For example, if the first data block 211 (e.g., column 1, row 1) includes 1,000 binary "1" symbols, then the first parity block 214 would be the result of performing an exclusive OR operation on the data block 211 with zero, resulting in 1,000 binary "1" symbols. When the all of the blocks in the first column are XOR-ed together, the result is zero (e.g., 1,000 binary "0" values). Similarly, the blocks in the second column or any other column should produce a result of zero when XOR-ed together. For all of the different variations of numbers of rows and columns, the parity blocks 214 can be generated so that, when accurately received, an XOR of all code block elements in the column (e.g., data elements 211 as well as the parity element 214 of the column) result in all zero binary values.

Figure 2C:
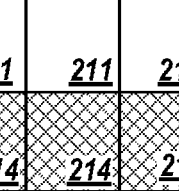

As another example, FIG. 2C shows an interleaver with three columns and three rows providing a code rate of 2/3. To achieve the desired code rate, there are two rows of data code block elements 211 and one row of parity code block elements 214. In this arrangement, the data in each parity block 214 is the result of XOR-ing the data code block elements 211 in the same column. As a result, XOR-ing all of the blocks in a column (e.g., data blocks 211 and the parity block 214) results in all zero binary values.

An example of values to be transmitted is illustrated in the figure. If column 1, row 1 includes binary values "0101010101" and column 1, row 2 includes values "1010101010," then the parity block 214 in column 1, row 3 includes the result of XOR-ing the data values, e.g., "1111111111." With this arrangement, a receiver can verify the validity of the received data sequence by XOR-ing all of the code block elements in a column together, and determining whether the result is zero.

The parity information can be used to correct errors due to the periodic blockage. In particular, as discussed below, the interleaver parameters and organization of the transmissions can be sent so that corruption is limited to one block 211 or 214 per column in each ULPE code block 210 that is sent. That way, when errors are detected within a code block element 211, the parity information in the corresponding code block element 214 for the column (and other code block elements 211 in the column, if present in the code block structure) can be used to correct the errors.

The system use various techniques to enable automatic reconfiguration of transmission parameters to adapt to changing conditions. One technique is for the receiver to detect the transmitted ULPE interleaver parameters in an automated way. Another technique is for the receiver to determine desired interleaver parameters and communicate to the transmitter the desired ULPE dimension to use for transmissions. Either or both of these techniques can be used to optimize throughput.

A technique of determining the desired interleaver parameters will be described first. This technique can be used by a receiver to determine desired interleaver parameters, which the receiver can then send to the transmitter for use in transmitting data to the receiver. The number of columns in the ULPE code block 210 can be set based on the duration of the intermittent blockage (e.g., an average or maximum duration) over a recent window of time. The number of columns is generally determined so that any individual blockage will not have a duration greater than the duration to transmit one row of a ULPE code block 210. Thus, the number of columns in the interleaver can be set based on the blockage duration and the duration of individual ULPE code blocks 210. Since the blockages may not be synchronized with the burst boundary, the number of columns can have at least one extra ULPE code block 210.

The number of rows in each column is typically based on the code rate and the blockage interval. For example, a larger number of rows may be desired for greater transmission efficiency (e.g., a higher ratio of data to parity or other ECC information). However, the number of rows can be set so that the total size of the ULPE code block 210 is also short enough that no more than one full duration of the intermittent blockage will coincide with any given ULPE code block 210. The maximum number of rows should make the time duration of the ULPE interleaver be less than the blockage interval, while the number of rows is at least two including the parity row. More rows provides a higher ULPE outer FEC code rate and results in higher throughput.

As an example, consider a situation where the duration of an individual blockage is 3 milliseconds (ms) and the blockages repeat at an interval of 10 ms. Transmission of one code block element 211 may take 1 ms, for example, sending 1,000 symbols at 1 Megasymbol per second (M-sym/s). In that case, at least 3 columns are included in the ULPE code block 210 and corresponding interleaver. The number of columns needs to be high enough that the transmission duration for each row of the ULPE code block 210 is at least as high as the duration of an individual blockage. To facilitate measuring and adaptation, and to provide a buffer for changing blockage conditions, the number of columns can be increased from this minimum level. In this example, four columns can be used. As a result, the interleaver would arrange the data in 4 columns. This will ensure that any instance of the intermittent blockage does not affect more than one code block element 211 or 214 from each row of the ULPE code block 210.

The number of rows can be set based on the blockage interval, so that multiple blockages do not occur during the span of a single ULPE code block 210. For example, if the blockage occurs every 10 ms, the number of rows can be set so the ULPE code block 210 has a transmission duration that is no more than 10 ms. The desired number of columns can be used in this determination of row count. For example, given the use of four columns and other conditions noted above, the transmission of one row (e.g., four code block elements 211 or 214) would have a duration of 4 ms. This means that only two rows, with a total of 8 ms duration, would be able to be transmitted fully before a second blockage occurs. Accordingly, two rows would be used, with one of them being designated for parity blocks 214. At the code block element level, this corresponds to a code rate of 1/2 (e.g., not factoring in overhead within code block elements 211, such as header sections 224 and parity portions 222).

For example, a periodic blockage may corrupt bits in the first code block element 211 (e.g., column 1, row 1) but not the second code block element 211 (e.g., column 1, row 2). The presence of errors in the first code block element 211, and the absence of errors in the second code block element 211 can be determined using the respective parity section 222 of those code block elements 211. In this case, by performing an XOR operation over both code block elements 211 and the parity code block element 214, any non-zero bits in the XOR result would indicate bits in the first code block element 211 (e.g., column 1, row 1) that are incorrect and can be changed (e.g., 0 to 1, or 1 to 0) to correct the data stream. Other correction algorithms and techniques can also be used.

As shown in FIG. 2A, each data code block element 211 includes a parity portion 222 that enables a receiver to determine whether there are errors within the data code block 211. A receiver can attempt to decode each data code block element 211, and if there are errors detected in decoding the code block element 211, the parity information 214 for the column in which the code block element 211 occurs and the other code block elements 211 in the column can be used to correct the errors.

In some implementations, each column in a ULPE code block 210 represents a data burst of hundreds or thousands of bits. As a result, the interleaver for a ULPE code block 210 can be relatively large. For example, one example may include 8 columns, with each column involving transmission of 1000 bits, so the interleaver would have a size of 8000 bits.

As discussed further above and below, the number of rows and columns can vary dynamically to adjust to changing conditions. For example, the number of rows can be adjusted to implement different code rates and/or blockage intervals, and the number of columns can be adjusted for different blockage durations. Accordingly, different sized of interleavers can be used, e.g., with different amounts or sizes of memory being dedicated for the interleaver function according to the current characteristics of the ULPE code block 210 being sent or received.

In some implementations, to detect the ULPE interleaver parameters, the receiver only needs to know that the ULPE scheme is being used. No other advance information is needed by the receiver in order to decode received transmissions using ULPE, even when the transmitter changes the interleaver parameters (e.g., number of rows and columns, and the code rate as a result). In some cases, the ULPE interleaver parameters are not known initially at the receiver. To find out the dimension, the receiver counts the number of code block elements 211 and 214 between the Begin ULPE Code Block Indicator bits (e.g., assertion of the "start of block" header bit field 229). That gives the total number of code block elements 211 and 214 in the interleaver. The information from one "start of block" assertion up to the next "start of block" assertion represents a single ULPE code block 210.

The receiver also counts the number of parity code block elements 214, e.g., the number of parity blocks that occurred just prior to the Begin ULPE Code Block Indicator. The count of parity code block elements 214 indicates the number of columns. For example, if five code block elements 214 are found to have a "1" for the "parity block" header bit field, then the ULPE code block 210 can be determined to have five columns. The number of rows in the interleaver is the total number of code block elements in the interleaver divided by the number of columns.

Generally, the code block elements 211 and 214 have equal lengths. The length of the code block elements 211 and 214 can be predetermined. In some implementations, the length of the code block elements can be determined by the receiver. For example, the amount of bits from one assertion of the "parity block" header bit field until just before the next assertion of the "parity block" header bit field can indicate the length of a single code block element 211 and 214.

Referring back to FIG. 1, the gateway 110 can transmit the ULPE code block 116 to the terminal 140 via the satellite 120. This occurs by transmitting the sequence of code block elements 150a (e.g., elements B1-B8 and P1-P4) in the order specified by the interleaver. In this example, the interleaver for the ULPE code block 116 includes four columns with two data rows (one with code block elements B1-B4 and one with code block elements B5-B8) and one error checking row with code block elements P1-P4. Thus, the communication parameters 115 include a 2/3 FEC rate (at least at the code block element level) and an interleaver dimension of three rows and four columns. The transmission of the ULPE code block 116 occurs row-by-row in order to interleave the contents of the columns. For example, the order of transmission of the code block elements can be B1, B2, B3, B4, B5, B6, B7, B8, P1, P2, P3, P4.

As the code block elements 150b of the ULPE code block 116 are transmitted from the satellite 120 to the terminal 140, the transmission passes through the path of the blades 132 of the rotor 131. As a result, reception of some of the code block elements 150b can be corrupted if a blade 132 blocks the line of communication 133 while the code block element 150b transmission is passing the path of the blades 132. In this example, code block elements B3-B5 were corrupted by the blades 132. This represents a single blockage, affecting a single consecutive set of code block elements 150a in the ULPE code block 116, during the course of the transmission of the ULPE code block 116. For example, this can involve a single rotor blade passing once through the direct line of sight between the receiver 144 and the satellite 120. In this example, the duration of the blockage is longer than the transmission duration for two code block elements 150a but no more than for three code block elements 150a.

When the receiver 144 receives the code block elements 150b, the receiver 144 can determine the communication parameters 115 used to transmit the code block elements 150b. For example, the receiver 144 may not know (e.g., may not have information specifying) the communication parameters 115 prior to receiving the code block elements 150b. Instead, the receiver 144 may only know that the ULPE technique is being used to transmit the data. The receiver 144 can use the control bits in the header information (described with reference to FIG. 2A) to determine the communication parameters 115 that were used to generate the transmission.

The receiver 144 can determine the total number of code block elements in each ULPE code block using the start of block control bit. As described above, the start of block control bit is set for the first data code block element of a ULPE code block. To determine the total number of code block elements in each ULPE code block, the receiver can count the total number of code block elements between two successive code block elements that have the start of block control bit asserted (e.g., set to "1" or another predetermined value). In this example, the number of code block elements in a ULPE code block is the number code block elements between the two successive code block elements plus one for the code block element with the "start of block" control bit asserted. In the example illustrated in FIG. 1, the transmitter 112 would assert the start of block control bit for code block element B1, but not for the other code block elements B2-B8 or P1-P4. The receiver 144 can count the code block elements B2-B8 and P1-P4, as the next code block element after P4 would be the start of another ULPE code block and have its start of block control bit asserted. In this example, there are a total of 12 code block elements or elements in the ULPE code block 116: one code block element B1 with the start of block control bit set, and 11 additional code block elements (B2-B8 and P1-P4).

The receiver 144 can determine the number of columns in the interleaver based on the number of code block elements having a parity control bit asserted (e.g., set to a value of "1"). The transmitter can assert the parity control bit in each code block element P1-P4 that includes error checking data. As there is a code block element P1-P4 for each column of the interleaver dimension, the receiver 144 can determine that the number of columns in the interleaver dimension is the number of code block elements for which the parity control bit is asserted.

The receiver 144 can determine the number of rows in the interleaver dimension based on the total number of code block elements in each ULPE code block and the number of columns of the interleaver dimension. For example, the number of rows in the interleaver dimension can be equal to the total number of code block elements in the ULPE code block divided by the number of columns in the interleaver dimension.

The receiver 144 can use the calculated communication parameters 146 to decode the received ULPE code block 145. For each of the transmitted code block elements B1-B8, the receiver 144 uses the parity portion 222 of the data code block element to verify the integrity of the data. In the example, this process would reveal that each of the code block elements B3-B5 were corrupted, while the others were received correctly. The receiver 144 then uses the information in the other code block elements 150b in the column to correct the errors. For example, for the first column, the receiver 144 would use the correctly received code block elements B1 and P1. The receiver 144 can perform an XOR operation over code block element B1, the corrupted code block element B5, and parity code block element P1. The non-zero bits in the XOR result indicate bit positions where the corrupted code block element B5 should be corrected. Similarly, for the third column, the receiver 144 can perform an XOR operation for the received code block elements B3, B7, and P3, and the non-zero bits in the XOR result indicate bit positions where the corrupted code block element B3 should be corrected. Errors in the code block element B4 can be corrected using the same technique on blocks in the fourth column.

In some implementations, the receiver 144 can determine desired or optimized communication parameters and then inform the satellite 120 of the communication parameters to use. The receiver 144 can calculate communication parameters on a repeated or ongoing basis to adjust the communication parameters to maximize throughput and avoid uncorrectable errors. As part of this process, the receiver 144 can determine, e.g., measure, the blockage interval and blockage duration. The blockage duration can be equal to the time duration of the number of consecutive code block elements that are corrupted. A code block element can be considered corrupted when inner LDPC analysis fails to converge to a codeword. At a given symbol rate, which may be known in advance by the receiver 144, the duration of a code block element transmission is known. This code block element transmission duration is the time duration for the transmitter 112 to transmit an entire code block element 150a. Using this code block element transmission duration and the number of consecutive code block elements that are corrupted, the receiver 144 can determine the blockage duration. For example, the receiver 144 can determine that the blockage duration is product of the duration of a code block element transmission multiplied by the number of consecutive code block elements that are corrupted.

In some implementations, the receiver 144 can determine a more granular blockage duration, e.g., for blockages that being and/or end within a ULPE code block. For example, the receiver 144 can evaluate the received signal strength or signal to noise ratio on a sliding window of symbols within a burst to determine where in a ULPE code block a blockage started or finished.

In some implementations, the receiver 144 can determine the blockage duration over multiple ULPE code blocks. For example, the receiver 144 can determine the blockage duration for each of multiple ULPE code blocks. The receiver 144 can determine, as the blockage duration, the average or median (or other measure of central tendency) of the individual blockage durations. In this way, any random variants in blockage durations can be removed.

The receiver 144 can determine the blockage interval based on the time duration between the beginning of a blockage duration to the beginning of the next blockage duration. For example, the receiver 144 can determine the number of consecutive code block elements that are corrupted by a first blockage. The receiver can also determine a number of non-corrupted code block elements after the first blockage but before a second blockage (e.g., with no intervening blockages between the first and second blockages). The receiver 144 can determine a sum of the number of corrupted code block elements and the number of non-corrupted code block elements. The receiver 144 can then determine, as the blockage interval, a product of the duration of a code block element transmission multiplied by the sum of the number of corrupted code block elements and the number of non-corrupted code block elements.

For example, a first blockage may corrupt two consecutive code block elements. Then four code block elements may be received without error before another two code block elements are corrupted by a second blockage. In this example, there is a total of six code block elements between the beginning of the first blockage and the beginning of the second blockage (i.e., the first two corrupted code block elements plus the four non-corrupted code block elements). If the duration of a code block element transmission is one millisecond (ms), the receiver 144 can determine, as the blockage interval, the product of 1 ms duration×6 code block elements=6 ms.

Similar to the blockage duration, the receiver 144 can determine the blockage interval over multiple ULPE code blocks. For example, the receiver 144 can determine the blockage interval for each of multiple ULPE code blocks. The receiver 144 can determine, as the blockage interval, the average or median (or other measure of central tendency) of the individual blockage intervals. In this way, any random variants in blockage durations can be removed. As the blockage duration and the blockage interval can change when the helicopter 130 maneuvers or during its flight path, the receiver 144 can determine the blockage duration and blockage interval continuously or periodically, e.g. based on a specified time period.

The receiver 144 can use the blockage interval and the blockage duration to adjust the communication parameters 115, e.g., to determine new communication parameters 146 for the gateway 110 to use for future transmissions. That is, the receiver 144 can dynamically change the communication parameters 115 based on the periodic blockages of the rotor 131 to improve the data throughput between the gateway 110 and the terminal 140.

The receiver 144 can determine the interleaver dimension that maximizes the data throughput based on the blockage duration and the blockage interval. In some implementations, the receiver 144 determines the number of columns in the interleaver dimension based on the blockage duration. For example, the number of columns can be based on the quotient of the blockage duration divided by the code block element transmission duration. In a particular example, the number of columns can be equal to the quotient of the blockage duration divided by the code block element transmission duration plus a constant value, e.g., a value of one. This provides a buffer column, increasing the likelihood that any errors can be corrected.

In some implementations, the number of columns can be equal to the quotient of the blockage duration divided by the code block element transmission duration plus a constant value that is greater than one. A value greater than one can be used to sense a change in the blockage duration, such as when the incident angle becomes more oblique or when the propeller changes its rotational speed. By having a constant that is greater than one, the direction of the changes in the blockage duration can be detected while still being able to decode correctly. The number of columns can also be adjusted to accommodate blockage duration changes. The number of rows can be correspondingly changed to make the ULPE interleaver duration less than the blockage interval.

The receiver 144 can determine the number of rows in the interleaver dimension based on the blockage interval. For example, the number of rows can be equal to the quotient of the blockage interval divided by the time duration to transmit an entire row of columns. That is, if there are three columns, the number of rows can be equal to the blockage interval divided by the time duration to transmit four code block elements (one in each column).

By calculating the interleaver dimension in this way, an entire ULPE code block can be transmitted past the rotor 131 during a blockage interval with no more than one code block element in each column being corrupted. This allows the receiver 144 to determine the data that was corrupted using the error checking data. The number of rows can be increased for longer blockage intervals, enabling more data rows per error checking row, which increases the data throughput. Thus, when the blockage interval is longer, the coding can be increased to increase data throughput. However, when the blockage interval is shorter, the coding can be reduced to ensure that the corrupted data can be resolved accurately by the receiver 144.

As described above, the coding can be a result of the number of rows. For example, the coding can be (the number of rows minus one)/(the number of rows). If the receiver 144 determines that there should be two rows in the interleaver dimension, the coding would be 2/3 in this example.

After determining the new communication parameters 146, the receiver 144 can communicate the communication parameters 146 to the gateway 110 so that the transmitter 112 can use the communication parameters 146 for future data transmissions to the terminal 140 of the helicopter 130. In some implementations, the receiver 144 sends, to the gateway 110, data specifying the communication parameters 146. For example, the receiver 144 can include the data in code blocks 152 sent to the gateway 110.

The receiver 144 can periodically or repeatedly measure the blockage duration and blockage interval, and can calculate new sets of desired communication parameters 146 in response to detected changes. For example, as the blockage duration increases the number of columns can be increased (e.g., to make sure that no more than one code block element per row is affected by a blockage). The number of rows may also be decreased to be able to fit an entire ULPE code block within one blockage interval. If the blockage duration decreases, the number of columns can be decreased, and more rows can be used to provide a higher code rate. As another example, as the blockage interval increases the number of rows can be increased (e.g., increasing transmission efficiency with a higher code rate). As the blockage duration decreases the number of rows can be decreased (e.g., increasing robustness and maintaining ability to correct errors using a lower code rate).

In some implementations, the transmitter 142 transmits, to the gateway 110, data according to the communication parameters 146. For example, the receiver 144 can communicate the communication parameters 146 to the transmitter 142. The transmitter 142 can then send the code blocks 152 to the gateway 110 using the communication parameters 146. The receiver 114 can be configured to determine the communication parameters 146 using the control bits in the code block headers 224, similar to the receiver 144 as described above.

After receiving the communication parameters, the transmitter 112 can transmit data according to the communication parameters. In some implementations, the transmitter 112 can notify the receiver 144 of a future time at which the transmitter 112 will being using the updated communication parameters 146. In this way, the receiver 144 may not have to determine the communication parameters 146 before determining the blockage duration and the blockage interval.

As the conditions change, e.g., based on changes in the incident angle 134, the gateway 110 and terminal 140 can adapt autonomously by updating the communication parameters to provide the highest throughput for the conditions. For example, this technique of determining updated communication parameters based on current blockages can be performed periodically during a flight to ensure that the communication parameters are optimized for the current conditions. In particular, the receiver 144 can be configured to repeatedly evaluate the blockage interval and blockage duration during a flight path of the helicopter. The receiver 144 can determine, or request, a different interleaver dimension in response to changes in the blockage interval and blockage duration.

Figure 3:
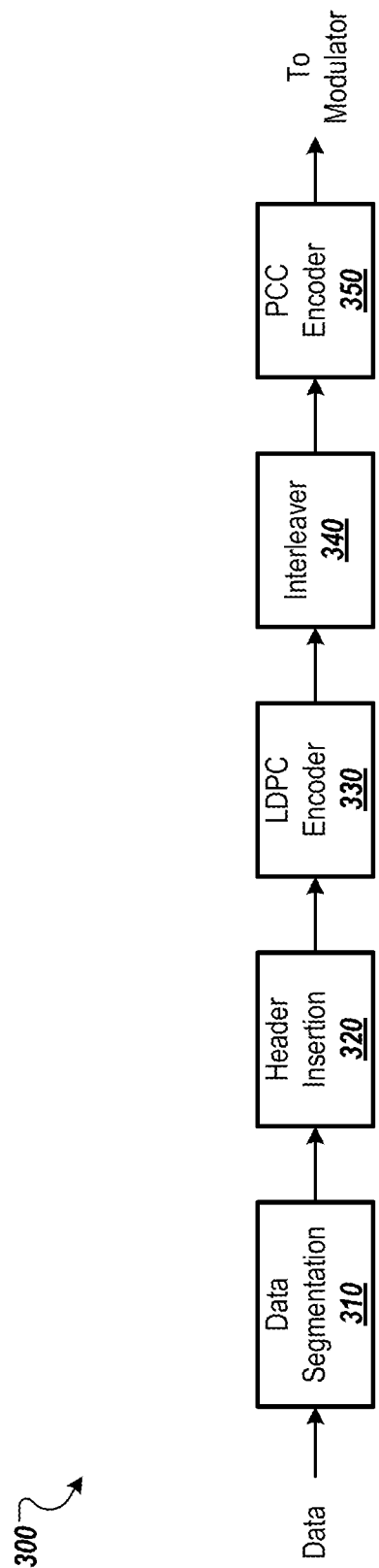
FIG. 3 is diagram showing example components of a transmitter.

FIG. 3 is diagram showing example components of a transmitter 300. The transmitter 112 and/or the transmitter 142 of FIG. 1 can be implemented using the transmitter 300.

The transmitter 300 includes a data segmentation component 310, a header insertion component 320, an LDPC encoder 330, an interleaver 340, and a PCC encoder 350.

The data segmentation component 310 segments input data into multiple code block elements. For example, the data segmentation component 310 can generate multiple data blocks having the same or similar size such that each data block can be included in a code block element.

The header insertion component 320 generates the header for each code block element. The header insertion component 320 can include, in the header of each code block element, any header information outside of the control bits, which are handled later by the PCC encoder 350.

The LDPC encoder 330 encodes each data block into an individual code block element. The LDPC encoder 330 can generate, for each code block element, error checking data for the code block element using an error checking code.

The interleaver 340 can arrange the code block elements into tabular form based on the interleaver dimension. As described above, the interleaver dimension includes a number of rows and a number of columns. The interleaver 340 can assign each code block element to a particular cell. The interleaver 340 can assign the code block elements to all but the last row where the error checking data will be assigned.

The PCC encoder 350 can generate error checking data for each column. The PCC encoder 350 can determine the error checking data for a column by performing an XOR operation on the set of code block elements in the column.

The PCC encoder 350 can generate a row of error checking code block elements that includes, in each column, the error checking code block element for that column.

The PCC encoder 350 can also set the control bits for the appropriate code block elements. For example, the PCC encoder 350 can set the start of block control bit in the header of the code block element in the cell in the first column of the first row. The PCC encoder 350 can also set the parity control bit for each error checking code block element. The PCC encoder 350 can then send the code block elements to a modulator for modulation and then transmission as a ULPC code block to a receiver.

Figure 4B:
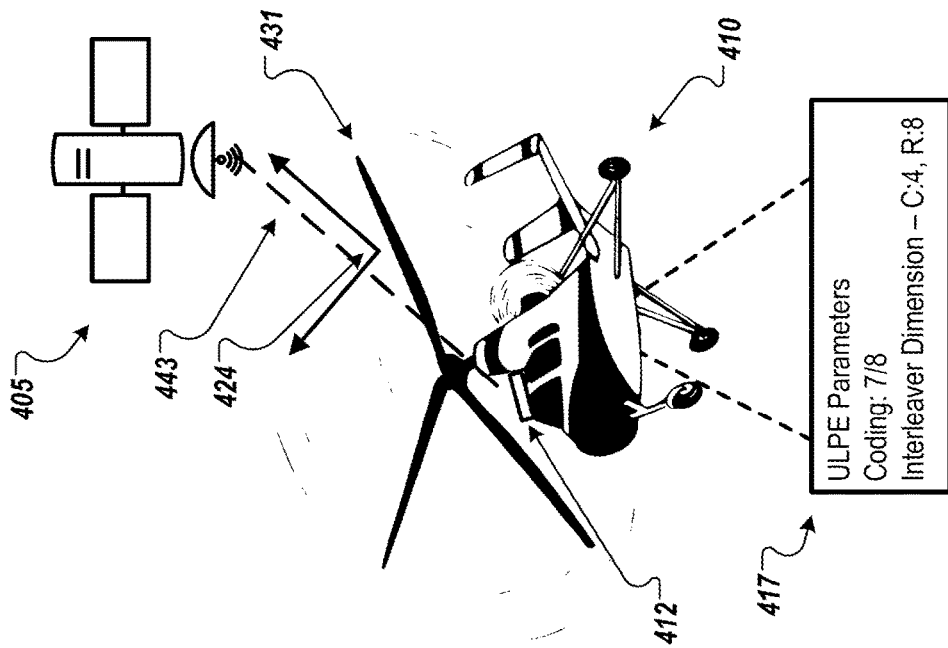
FIG. 4B is another diagram showing a line of communication between a satellite and a helicopter and communication parameters for transmitting code blocks from the satellite to a receiver of the helicopter.
Figure 4A:
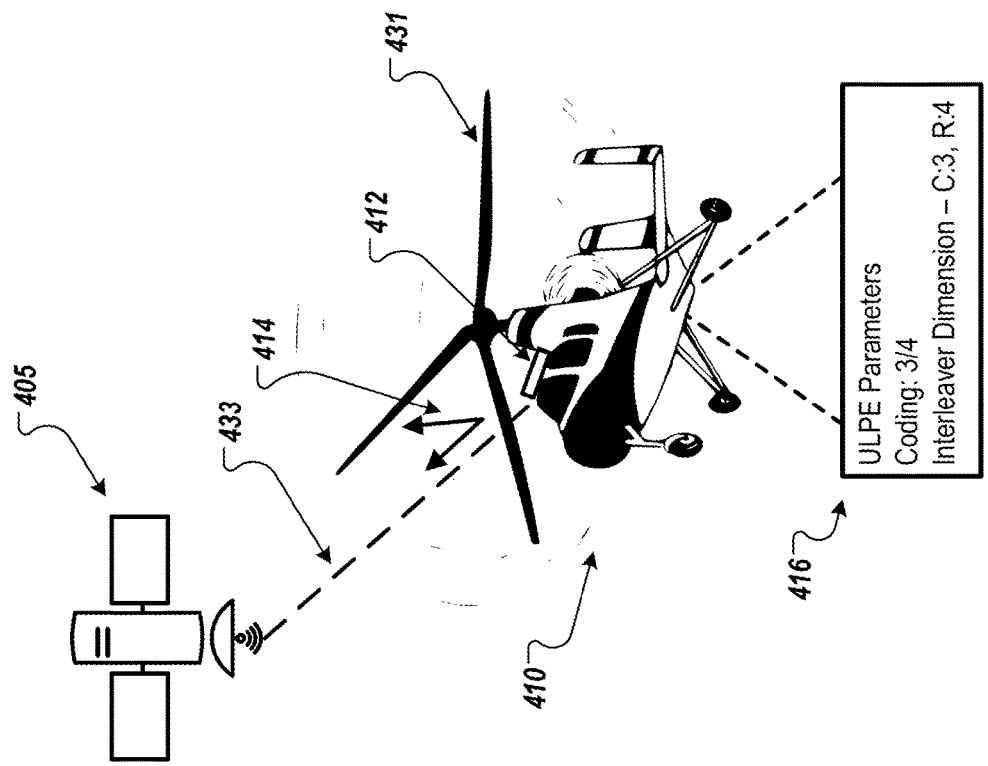
FIG. 4A is a diagram showing a line of communication between a satellite and a helicopter and communication parameters for transmitting code blocks from the satellite to a receiver of the helicopter.

FIG. 4A is a diagram showing a line of communication 433 between a satellite 405 and a terminal 412 of a helicopter 410 and communication parameters 416 for transmitting code blocks between the satellite 405 and the terminal 412 of the helicopter 410. The satellite 405 and the terminal 412 can communicate data between each other along the line of communication 433, which meets the blades of the rotor 431 at an incident angle 414. In this example, the communication parameters 416 include ULPE parameters, including a 3/4 coding (i.e., three rows of data and one row of error checking data) and an interleaver dimension of three columns and four rows.

As described above, the incident angle 414 can change when the helicopter 410 maneuvers or moves along its flight path. As shown in FIG. 4B, the helicopter 410 has maneuvered such that there is a different line of communication 443 between the satellite 405 and the terminal 412 of the helicopter 410. The line of communication 443 meets the blades of the rotor 431 at a different incident angle 424 than the incident angle 414. This incident angle 424 results in the surface of the blades of the rotor 431 that blocks the line of communication 443 being thinner than the surface of the blades of the rotor 431 that blocks the line of communication 433 with the incident angle 414. Thus, the blockage interval and the blockage duration are different in FIGS. 4A and 4B based on the different incident angles. The receiver of the terminal 412 can adjust the communication parameters 416 to account for the different blockage interval and blockage duration for the incident angle 424. In this example, the blockage duration is shorter and the blockage interval is longer for the incident angle 424 based on a thinner blade surface. Thus, the coding in the adjusted communication parameters 417 is higher (i.e., seven rows of data and one row of error checking data) and the interleaver dimensions includes more rows (i.e., eight rather than four) and more columns (i.e., four rather than three) than the communication parameters 416.

Figure 5:
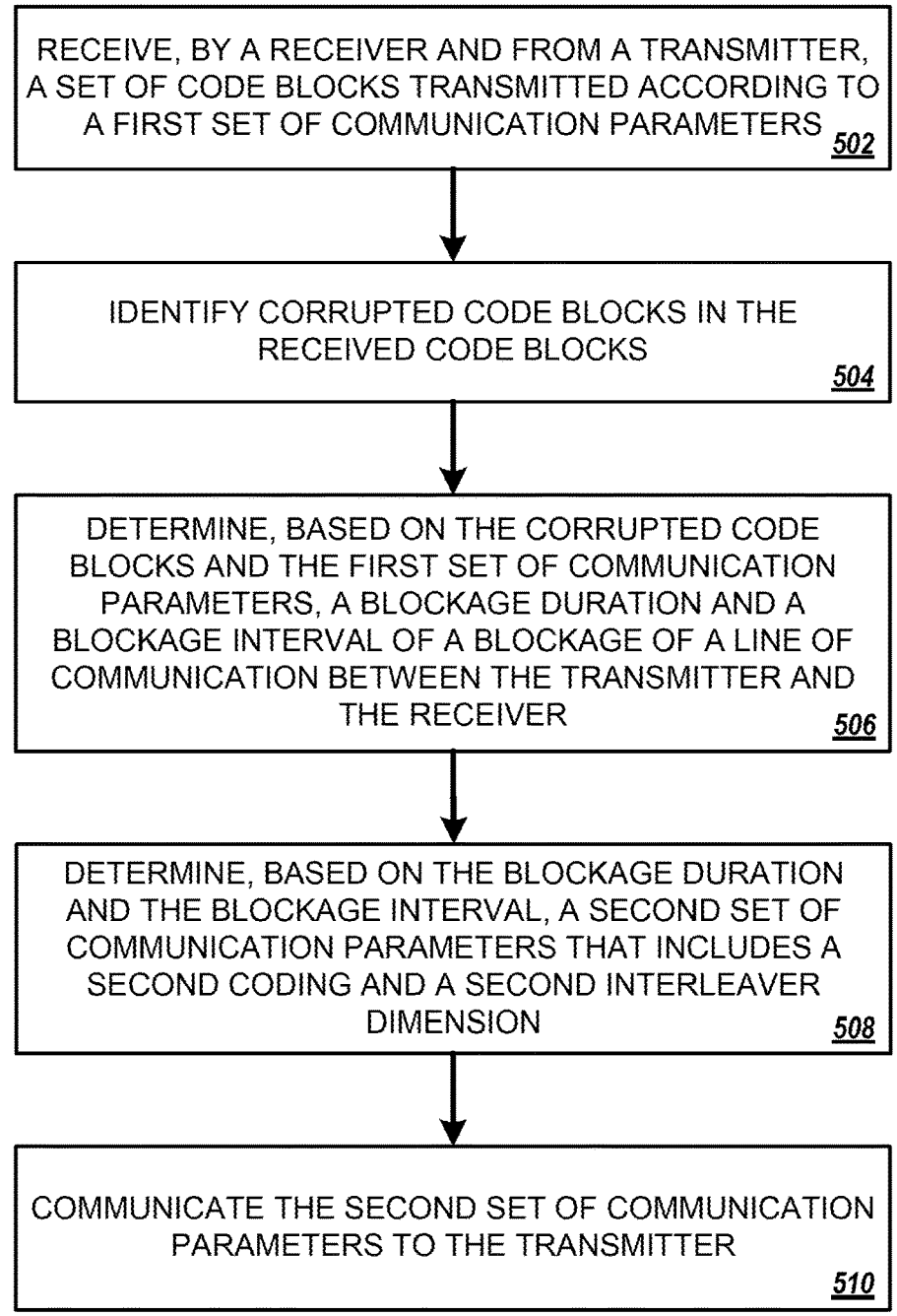
FIG. 5 is a flow diagram illustrating an example of a process for changing communication parameters to address a periodic blockage in a communication link.

FIG. 5 is a flow diagram illustrating an example of a process 500 for changing communication parameters based on a blockage duration and blockage interval of a periodic line of communication blockage. The process 500 can be performed by a wireless receiver, such as the satellite receiver 144 or the satellite receiver 114 of FIG. 1. For example, the process 500 can be performed by a satellite receiver of a terminal mounted on a helicopter.

A receiver receives, from a transmitter, a set of code blocks transmitted according to a first set of communication parameters (502). For example, the set of code blocks can include several ULPE code blocks that each include a sequence of code block elements. The first set of communication parameters can include one or more first interleaver parameters and/or a code rate.

When the helicopter begins a flight, a gateway sending data to the helicopter's terminal can start with an initial set of communication parameters. This initial set of communication parameters can be the most robust communication parameters adapted for worst case conditions. In another example, the initial set of communication parameters can be communication parameters selected for the estimated worst case conditions of the current flight.

The receiver identifies one or more at least partially corrupt code block elements in the received set of ULPE code blocks (504). For example, the receiver can identify, as corrupt code block elements, any code block element for which at least a portion of the data of the code block is corrupted or missing. In a particular example, the receiver can identify, as corrupt code block elements, any code block element for which analysis of the inner LDPC data fails to converge to a codeword. For example, when the LDPC data indicates an error or mismatch with respect to the data portion in the data code block element, the code block element can be determined to be at least partially corrupt.

The receiver determines a blockage duration and a blockage interval of a blockage of a line of communication between the transmitter and the receiver (506). The receiver can determine the blockage duration and the blockage interval based on based on the one or more at least partially corrupted code block elements and the first set of communication parameters. The blockage duration is a duration of the blockage and the blockage interval is a period of time between successive (e.g., consecutive) blockages.

As described above, the receiver can determine the interleaver dimensions based on control bits of the code block elements. The receiver can then use the interleaver dimensions, the code block elements that are corrupted, and the code block element transmission duration to determine the blockage duration and the blockage interval experienced by the set of code block elements.

The receiver can use the code block transmission duration and the number of consecutive code blocks that are corrupted to determine the blockage duration. For example, the receiver can determine that the blockage duration is product of the duration of a code block element transmission multiplied by the number of consecutive code block elements that are corrupted. That is, the blockage duration is the time duration for transmitting the consecutive code block elements that were corrupted.

In some implementations, the receiver can determine the blockage duration by identifying multiple sequences of consecutive corrupted code block elements in multiple sets of code blocks, e.g., in multiple different ULPE code blocks. The receiver can determine, for each sequence of consecutive corrupted code block elements, a time duration for transmitting the sequence of consecutive corrupted code block elements. The receiver can determine, as the blockage duration an average (or median) of the time durations.

The receiver can determine the blockage interval based on the time duration between the beginning of a blockage duration to the beginning of the next blockage duration. For example, the receiver can identify a first blockage corresponding to a first sequence of consecutive corrupted code blocks in the set of code block elements. The receiver can identify a second blockage corresponding to a second sequence of consecutive corrupted code blocks in the set of code block elements. The first blockage and the second blockage can be successive blockages without any intervening blockages. The receiver can then determine a time duration between a beginning of the first blockage and a beginning of the second blockage.

In some implementations, the receiver can identify multiple pairs of successive blockages in the set of ULPE code blocks. The receiver can determine, for each pair of successive blockages, a time duration between a beginning of a first blockage in the pair of successive blockages and a beginning of a second blockage in the pair of successive blockages. The receiver can then determine, as the blockage interval, an average of the durations of time.

The receiver determines, based on the blockage duration and the blockage interval, a second set of communication parameters that includes a second coding and a second interleaver dimension (508). This second set of communication parameters can be a desired or optimized set that provides the appropriate balance of robustness in the face of the recurring blockage and high throughput. In some implementations, the receiver determines the desired number of columns for the interleaver based on the blockage duration. For example, the number of columns can be based on the quotient of the blockage duration divided by the code block element transmission duration. In a particular example, the number of columns can be equal to the quotient of the blockage duration divided by the code block element transmission duration plus a constant value, e.g., a value of one.

The receiver can determine the desired number of rows for the interleaver based on the blockage interval. For example, the maximum number of rows can be equal to the quotient of the blockage interval divided by the time duration to transmit an entire row of code block elements. Depending on the implementation, the number of rows may be set to the maximum number allowed or to a lower number to meet a predetermined threshold.

The receiver communicates the second set of communication parameters to the transmitter for subsequent transmissions by the transmitter to the receiver (512). In some implementations, the receiver is part of a terminal that sends ULPE code blocks to a receiver coupled to the transmitter. For example, the receiver of the terminal of the helicopter can determine the second set of communication parameters. The transmitter of the terminal can send one or more ULPE code blocks that specify the second set of communication parameters to the receiver of a gateway. The receiver of the gateway can be communicably coupled to the transmitter of the gateway.

In some implementations, the receiver communicates the second set of communication parameters to the transmitter by using the second set of communication parameters to send data to the transmitter. For example, the transmitter of the terminal can send ULPE code blocks to the gateway using the second set of communication parameters. The receiver of the gateway can determine the second set of communication parameters based on the control bits of the control block elements, as described above.

After receiving the second set of communication parameters, the transmitter can use the second set of communication parameters to send ULPE code blocks to the receiver. The receiver can periodically perform the process 500 to improve the data throughput by adapting the communication parameters to the current periodic blockages, e.g., caused by a helicopter's rotor, or caused by interference or jamming, or caused by other conditions.

Figure 6:
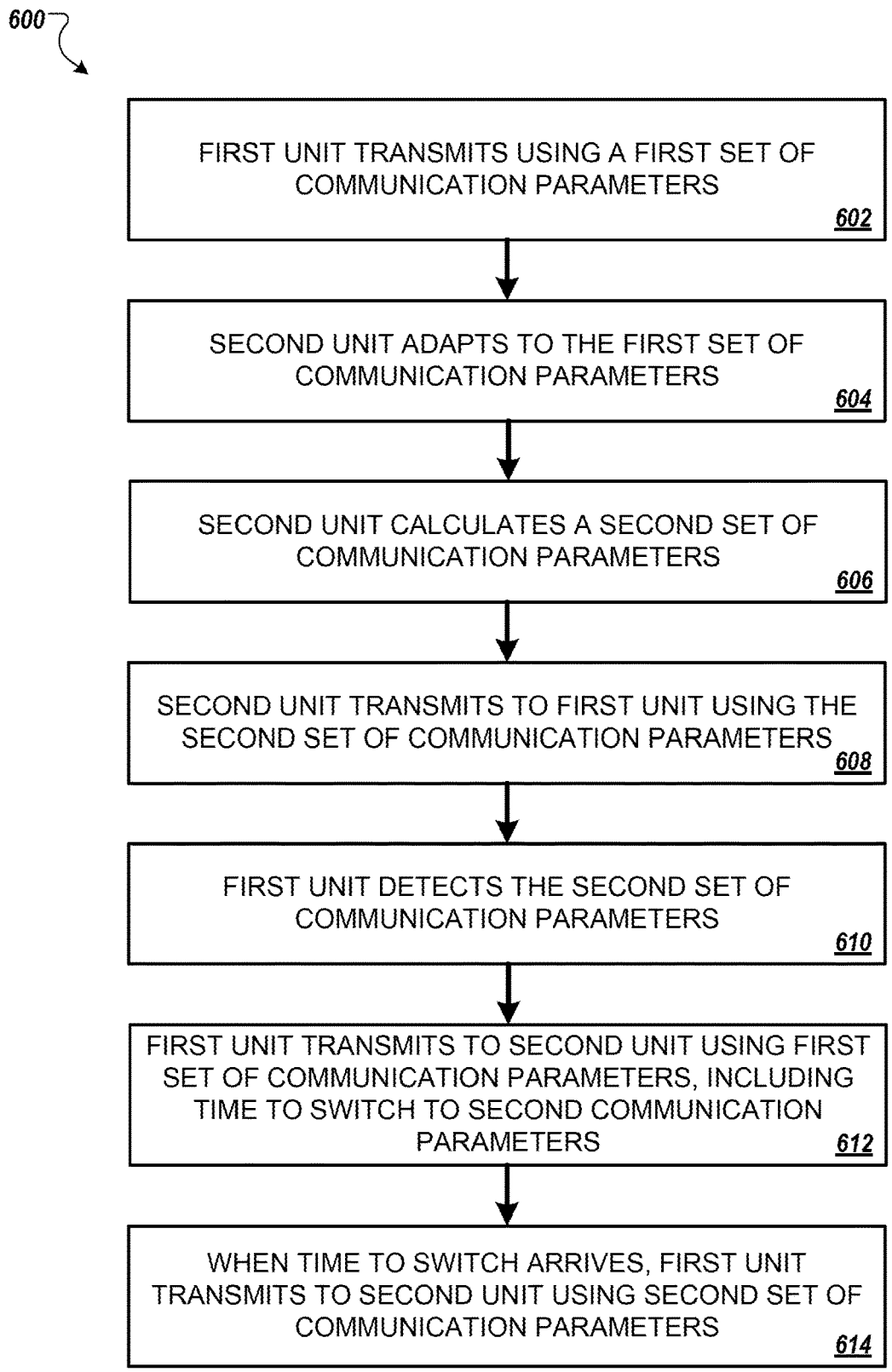
FIG. 6 is a flow diagram illustrating an example of a process 600 for changing communication parameters to address a periodic blockage in a communication link.

FIG. 6 is a flow diagram illustrating an example of a process 600 for changing communication parameters to address a periodic blockage in a communication link. The process 600 can be performed by a first wireless unit (e.g., the gateway 110 or the terminal 140 of FIG. 1 and a second wireless unit (e.g., the other of the gateway 110 or the terminal 140). The techniques described in process 600 can be used as a rate optimization handshaking process, through which the throughput of correctly received data can be maximized for the forward channel, the return channel, or both.

The first unit transmits data using a first set of communication parameters (602). The first set of communication parameters can be the most robust communication parameters adapted for worst case conditions. For example, the first unit and the second unit can use the most robust communication parameters initially, and optimize the communication parameters over time based on actual conditions, e.g., detected characteristics of periodic blockages. The receiver of the second unit can initially use a loop to detect the communication parameters used by the first unit to transmit data. For example, the receiver of the second unit can be placed into a "control bit detection mode" to receive an initial contact from the first unit. This control bit detection mode can involve the second unit inferring the number of rows and number of columns of an interleaver, as well as the total interleaver size (and thus the overall ULPE code block size) based on the values in the "Start of Block" field 229 and the "Parity Block" field 230 in the header portions 222 (see FIG. 2A).

The first unit can first transmit data using the most robust communication parameters, because this set of communication parameters has the best chance of overcoming the worst-case blockages. The most robust communication parameters can be set such that they can be received despite a blockage of a particular blockage duration, e.g., a predicted or typical blockage duration of 10 ms, 15 ms, 100 ms, or another appropriate blockage duration. For a 12 ms blockage duration estimate, the number of columns of the interleaver dimension can be long enough so that a data burst across each of the columns is at least as long as the blockage duration. For example, if a data code block element has a transmission duration of 4 ms, then the number of columns needed for a burst to exceed the estimated blockage duration is four (e.g., three elements of 4 ms each and one more element to exceed the blockage duration), for a total of 16 ms to transmit one row of information in the interleaver. For a 1/2 code rate, there would be one row of data elements and one row of parity or ECC elements, so the interleaver would have four columns and two rows, for a total transmission duration of 32 ms.

The second unit detects the communication parameters used by the first unit to transmit data and adapts to correctly decode the received data (604). For example, while in the control-bit detection mode, the receiver of the second unit can detect the first set of communication parameters of the data transmission received from the first unit using control bits, as described above. If the second unit is not already powered on, the second unit can power on and adapt to the communication parameters.

The second unit calculates a second set of communication parameters (606). In some implementations, the receiver can calculate the blockage duration and blockage interval of the received data transmission and determine communication parameters that provide the highest data throughput (while still being able to correct blockage-related data corruption) given the blockage duration and the blockage interval. For example, the receiver can determine the second set of communication parameters using operations of the process 500 illustrated in FIG. 5 and described above.

The second unit transmits data to the first unit using the second set of communication parameters (608). For example, a transmitter of the second unit can transmit, to the first unit, data using the second set of communication parameters rather than the first set of communication parameters.

The first unit detects the second set of communication parameters, e.g., using the control bit detection mode (610). A receiver of the first unit can receive the data transmission from the second unit and can detect the second set of communication parameters, as described above. For example, the first unit can also operate in a control-bit detection mode to detect control bits and determine the communication parameters based on the control bits.

While still using the first set of communication parameters (e.g., the most robust set, such as a code rate of 1/2), the first unit transmits data to the second unit indicating a time to switch to the second set of communication parameters (612). This data can include a notification that indicates time in the future when the first unit will start transmitting using the second set of communication parameters. For example, the first unit can determine a time at which to switch from the first set of communication parameters to the second set of communication parameters in response to detecting that the second unit transmitted data using the second set of communication parameters rather than the first set of communication parameters. Until that time is reach, the first unit can continue using the first set of communication parameters.

When the time to switch arrives, the first unit transmits to the second unit using the second set of communication parameters (614). The second unit will expect the data transmissions to use the second set of communication parameters based on the notification received from the first unit. The first unit can continue transmitting using the second set of communication parameters until the first unit detects a different set of communication parameters used by the second unit to send data to the first unit. For example, the second unit can periodically determine whether to adjust the communication parameters to account for current conditions, e.g., a current blockage interval and a current blockage duration.

The process 600 shows that a receiver of a satellite terminal, such as a receiver of a helicopter, can guide the satellite system to use the most appropriate interleaver parameters by simply calculating and using interleaver parameters to transmit data to the satellite system. The satellite system, on receiving transmissions with the desired interleaver parameters being used on the return channel, can detect the interleaver parameters used and can automatically adjust to use those same interleaver parameters on the forward channel to the terminal.

In some implementations, rather than notifying the second unit about a time to begin using the second set of communication parameters, the first unit can begin transmitting using the second set of communication parameters (e.g., optimized parameters) without notifying the second unit in advance. In other words, steps 612 and 624 can be omitted, and the first unit can begin transmitting using the second set of communication parameters any time after the second communication parameters are used to transmit to the first unit (or the first unit is otherwise notified of the desired change). In this example, after the second unit determines based on current conditions that a second set of communication parameters should be used (step 606) and the second unit transmits to the first unit using the second set of communication parameters (step 608), the second unit can operate in a mode that checks for two different sets of parameters: the first set of communication parameters (e.g., which the first unit used to transmit data) and the second set of communication parameters (e.g., which the second unit used to transmit data). The second unit can determine whether the data was transmitted according to the first or second set of communication parameters. This is because the second unit knows that the first unit will transmit to the second unit using either the first set of communication parameters or the second set of communication parameters. Once the second set of communication parameters are detected in a transmission from the first unit, the second unit can optionally stop evaluating the data transmissions for use of the first set of communication parameters.

In the event of significant changes in blockages, one or both units can fall back to transmitting data using a baseline or default set of communication parameters, e.g., the most robust set of communication parameters with a code rate of 1/2. The process 600 can then be used again to establish a new set of communication parameters that provides higher throughput.

This process 600 eliminates the need for have a communication parameter scheme table. The process 600 also establishes the better or optimized communication parameters at both units for two-way communication. The process 600 can be used periodically to continually adapt the communication parameters along a flight path.

In some implementations, the first unit can infer or detect characteristics of the blockages on the communication channel. The blockage duration would be the number of consecutive code block elements that were received in error. The blockage interval would be the time duration between the start of the blockage duration and the start of the next blockage duration. Observations of a number of blockage duration events can be averaged to remove random error occurrences due to noise. Typically, a transmitter would not be able to detect blockages at as fine-grained of a level as a receiver. For example, a transmitter may only detect blockage at the level of ULPE code blocks, because the transmitter often would not have information about the specific elements (e.g., LDPC-encoded data code block elements) that are affected. Nevertheless, if the transmitter received appropriate information about which ULPE code blocks and/or code block elements were corrupted (or which need to be re-transmitted), then the transmitter can determine a set of communication parameters, including interleaver parameters, to provide high throughput.

A number of implementations have been described. Nevertheless, it will be understood that various modifications may be made without departing from the spirit and scope of the disclosure. For example, various forms of the flows shown above may be used, with steps re-ordered, added, or removed.

Embodiments of the invention and all of the functional operations described in this specification can be implemented in digital electronic circuitry, or in computer software, firmware, or hardware, including the structures disclosed in this specification and their structural equivalents, or in combinations of one or more of them. Embodiments of the invention can be implemented as one or more computer program products, e.g., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

Particular embodiments of the invention have been described. Other embodiments are within the scope of the following claims. For example, the steps recited in the claims can be performed in a different order and still achieve desirable results.

What is claimed is:

1. A system comprising:
a data processing apparatus; and
a computer storage medium storing instructions that, when executed by the data processing apparatus, cause the data processing apparatus to perform operations comprising:
receiving, by a receiver and from a transmitter, code blocks transmitted according to a first set of communication parameters that includes one or more first interleaver parameters used to interleave information in the code blocks prior to transmission, wherein the one or more first interleaver parameters specify a first number of rows of code blocks and a first number of columns of code blocks for organizing sequences of code blocks, and wherein at least one of the rows includes error checking code elements such that each error checking code element provides error checking information for the column in which the error checking code element occurs;
identifying corrupted portions of at least some of the received code blocks;
determining, based on the corrupted portions of the received code blocks, a blockage duration and a blockage interval of a blockage of communication channel between the transmitter and the receiver, the blockage duration being indicative of a duration of the blockage and the blockage interval being indicative of a period of time between successive blockages;
determining, based on the blockage duration and the blockage interval, a second set of communication parameters that includes one or more second interleaver parameters, wherein the one or more second interleaver parameters specify at least one of (i) a second number of rows of code blocks that is different from the first number of rows of code blocks in the one or more first interleaver parameters or (ii) a second number of columns of code blocks that is different from the first number of columns of code blocks in the one or more first interleaver parameters; and
communicating the second set of communication parameters to the transmitter for subsequent transmissions by the transmitter to the receiver.

2. The system of claim 1, wherein determining the second set of communication parameters comprises determining the second number of rows of code blocks and the second number of columns of code blocks based on the blockage duration and the blockage interval.

3. The system of claim 2, wherein determining the second set of communication parameters comprises determining the second number of rows of code blocks and the second number of columns of code blocks such that corrupted portions of a subsequent transmission of code blocks is limited to a specified number of code blocks.

4. The system of claim 1, wherein determining the second set of communication parameters comprises:
determining the second number of columns of code blocks based on the blockage duration; and
determining the second number of rows of code blocks based on the blockage interval and a code rate.

5. The system of claim 1, wherein determining the second set of communication parameters comprises determining the second number of columns of code blocks such that a duration to transmit one row of a code block is less than or equal to the blockage duration.

6. The system of claim 1, wherein determining the second set of communication parameters comprises determining the second number of rows of code blocks based on the blockage interval such that multiple blockages do not occur during a span of a single code block.

7. The system of claim 1, wherein determining the second set of communication parameters comprises determining the second number of rows of code blocks based on the blockage interval such that a duration to transmit a single code block is less than the blockage interval.

8. The system of claim 7, wherein determining the second set of communication parameters comprises determining the second number of rows of code blocks based on the blockage interval and the second number of columns of code blocks.

9. The system of claim 1, wherein determining the second set of communication parameters comprises dynamically determining the second number of columns of code blocks and the second number of rows of code blocks based on changes in the blockage duration and changes in the blockage interval.

10. The system of claim 1, comprising changing a size of an interleaver of the transmitter based on the blockage duration and/or the blockage interval.

11. The system of claim 1, wherein communicating the second set of communication parameters to the transmitter comprises sending data specifying the second set of communication parameters to a receiver coupled to the transmitter.

12. The system of claim 1, wherein:
the error checking code elements comprise parity data; and
each column represents a burst of information comprising multiple code block elements, the transmission of code block elements of different columns being interleaved.

13. The system of claim 1, comprising determining, by the receiver, the one or more first interleaver parameters based on the received code blocks; and
decoding, by the receiver, one or more of the received code blocks based on the one or more first interleaver parameters.

14. The system of claim 1, wherein the operations comprise:
determining a total number of code block elements in a particular received code block by counting a number of code block elements between successive begin block indicators in the received code blocks;
determining a number of columns of an interleaver used transmit the received code blocks by counting a number of code block elements, between successive begin block indicators, that are marked as error checking code blocks; and
determining a number of rows of the interleaver by dividing the total number of code block elements in the particular received code block by the determined number of columns of the interleaver.

15. The system of claim 1, wherein determining the second set of communication parameters comprises determining a second number of columns for the interleaver based on a quotient obtained by dividing the blockage duration by a code block element duration that is a time duration needed to transmit one code block element.

16. The system of claim 1, wherein determining the second set of communication parameters comprises:
   determining a second number of rows based on a quotient obtained by dividing the blockage interval by a time duration needed to transmit all of the code blocks in a row; and
   determining the second set of communication parameters comprises determining the second coding based on the second number of rows.

17. The system of claim 1, wherein determining the blockage duration comprises determining a time duration for transmitting a series of consecutive code block elements that were each at least partially corrupted.

18. The system of claim 1, wherein:
   the transmitter is a transmitter of a satellite, and wherein the receiver is mounted on a helicopter that is in flight, and the receiver is oriented to communicate with the transmitter along a path that is periodically blocked by a rotating rotor of the helicopter; and
   the blockage duration and the blockage interval are based on at least one of a width of the rotor, a speed of rotation of the rotor, and an angle of a line of communication between the transmitter and the receiver; and
   the receiver is configured to repeatedly evaluate the blockage interval and blockage duration along a flight path of a helicopter, and dynamically request different interleaver parameters in response to changes in the blockage interval and blockage duration along the flight path of the helicopter.

19. A method, comprising:
   receiving, by a receiver and from a transmitter, code blocks transmitted according to a first set of communication parameters that includes one or more first interleaver parameters used to interleave information in the code blocks prior to transmission, wherein the one or more first interleaver parameters specify a first number of rows of code blocks and a first number of columns of code blocks for organizing sequences of code blocks, and wherein at least one of the rows includes error checking code elements such that each error checking code element provides error checking information for the column in which the error checking code element occurs;
   identifying corrupted portions of at least some of the received code blocks;
   determining, based on the corrupted portions of the received code blocks, a blockage duration and a blockage interval of a blockage of communication channel between the transmitter and the receiver, the blockage duration being indicative of a duration of the blockage and the blockage interval being indicative of a period of time between successive blockages;
   determining, based on the blockage duration and the blockage interval, a second set of communication parameters that includes one or more second interleaver parameters, wherein the one or more second interleaver parameters specify at least one of (i) a second number of rows of code blocks that is different from the first number of rows of code blocks in the one or more first interleaver parameters or (ii) a second number of columns of code blocks that is different from the first number of columns of code blocks in the one or more first interleaver parameters; and
   communicating the second set of communication parameters to the transmitter for subsequent transmissions by the transmitter to the receiver.

20. A non-transitory computer readable medium comprising instructions that, when executed by a data processing apparatus, cause the data processing apparatus to perform operations comprising:
   receiving, by a receiver and from a transmitter, code blocks transmitted according to a first set of communication parameters that includes one or more first interleaver parameters used to interleave information in the code blocks prior to transmission, wherein the one or more first interleaver parameters specify a first number of rows of code blocks and a first number of columns of code blocks for organizing sequences of code blocks, and wherein at least one of the rows includes error checking code elements such that each error checking code element provides error checking information for the column in which the error checking code element occurs;
   identifying corrupted portions of at least some of the received code blocks;
   determining, based on the corrupted portions of the received code blocks, a blockage duration and a blockage interval of a blockage of communication channel between the transmitter and the receiver, the blockage duration being indicative of a duration of the blockage and the blockage interval being indicative of a period of time between successive blockages;
   determining, based on the blockage duration and the blockage interval, a second set of communication parameters that includes one or more second interleaver parameters, wherein the one or more second interleaver parameters specify at least one of (i) a second number of rows of code blocks that is different from the first number of rows of code blocks in the one or more first interleaver parameters or (ii) a second number of columns of code blocks that is different from the first number of columns of code blocks in the one or more first interleaver parameters; and
   communicating the second set of communication parameters to the transmitter for subsequent transmissions by the transmitter to the receiver.

* * * * *